US012813344B2

(12) United States Patent
Lv

(10) Patent No.: US 12,813,344 B2
(45) Date of Patent: Nov. 24, 2026

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei City (CN)

(72) Inventor: Kaimin Lv, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 450 days.

(21) Appl. No.: 18/451,095

(22) Filed: Aug. 16, 2023

(65) Prior Publication Data

US 2024/0063187 A1 Feb. 22, 2024

Related U.S. Application Data

(63) Continuation of application No. PCT/CN2022/130069, filed on Nov. 4, 2022.

(30) Foreign Application Priority Data

Aug. 19, 2022 (CN) ........................ 202211000015.9

(51) Int. Cl.

*H10W 90/00* (2026.01)
*H10B 80/00* (2026.01)
*H10W 90/20* (2026.01)

(52) U.S. Cl.

CPC ............ *H10W 90/00* (2026.01); *H10B 80/00* (2023.02); *H10W 90/288* (2026.01);
(Continued)

(58) Field of Classification Search

CPC ............... H10W 90/00; H10W 90/291; H10W 90/297; H10W 90/288; H10W 90/722; H10B 80/00

See application file for complete search history.

(56) References Cited

U.S. PATENT DOCUMENTS 6,559,525 B2 * 5/2003 Huang ............. H01L 23/49575 257/713
8,941,233 B1 * 1/2015 Ngai .................. H01L 25/0657 257/706

(Continued)

FOREIGN PATENT DOCUMENTS

CN 102522380 A 6/2012
CN 103430301 A 12/2013

(Continued)

OTHER PUBLICATIONS

International Search Report in the international application No. PCT/CN2022/130069, mailed on Apr. 3, 2023. 6 pages with English translation.

(Continued)

*Primary Examiner* — Timor Karimy
(74) *Attorney, Agent, or Firm* — SYNCODA LLC; Feng Ma

(57) ABSTRACT

A semiconductor structure includes a carrier structure, and a stack structure located on the carrier structure. The stack structure includes at least one heat dissipation panel and at least one die module stacked onto one another, and the at least one die module includes at least one die. An area of an orthographic projection of the at least one heat dissipation panel on the carrier structure is greater than an area of an orthographic projection of the at least one die module on the carrier structure.

14 Claims, 6 Drawing Sheets

(52) U.S. Cl.
CPC ........ *H10W 90/291* (2026.01); *H10W 90/297* (2026.01); *H10W 90/722* (2026.01)

(56) References Cited

U.S. PATENT DOCUMENTS

| | | | | |
|---|---|---|---|---|
| 9,318,407 | B2 | 4/2016 | Liu | |
| 2008/0237844 | A1 | 10/2008 | Noveski et al. | |
| 2010/0176506 | A1 | 7/2010 | Hsu | |
| 2012/0299173 | A1 | 11/2012 | Mohammed | |
| 2014/0097533 | A1 | 4/2014 | Liu | |
| 2024/0047298 | A1 * | 2/2024 | Tong | H10P 70/20 |

FOREIGN PATENT DOCUMENTS

| | | | |
|---|---|---|---|
| CN | 103839903 | A | 6/2014 |
| CN | 112420640 | A | 2/2021 |

OTHER PUBLICATIONS

CN first office action in application No. 202211000015.9, mailed on Sep. 17, 2026.

* cited by examiner

SEMICONDUCTOR STRUCTURE AND METHOD FOR MANUFACTURING SEMICONDUCTOR STRUCTURE

CROSS-REFERENCE TO RELATED APPLICATIONS

This is a continuation of International Patent Application No. PCT/CN2022/130069 filed on Nov. 4, 2022, which claims priority to Chinese Patent Application No. 202211000015.9 filed on Aug. 19, 2022. The disclosures of the above-referenced applications are hereby incorporated by reference in their entirety.

BACKGROUND

A high bandwidth memory (HBM) is a new type of a memory. A die stacking technology, represented by the HBM, extends an original one-dimensional memory layout to a three-dimensional memory layout. That is, a plurality of dies are stacked onto one another and are packaged, which greatly improves a density of the dies and realizes a large capacity and a high bandwidth of the memory.

However, with the increase of the number of stacked dies, a heat generated by the dies during operation is accumulated, which causes a bad influence on the product performance. For example, the increase of a temperature affects a volume of a semiconductor structure, and in turn leads to the mechanical cracks in a material. The increase of the temperature also affects the electrical performance of the dies, and in turn makes it difficult to achieve the expected function.

SUMMARY

Embodiments of the disclosure relate to the field of semiconductors, and in particular to a semiconductor structure and a method for manufacturing a semiconductor structure.

Embodiments of the disclosure provide a semiconductor structure and a method for manufacturing a semiconductor structure.

According to some embodiments of the disclosure, one aspect of some embodiments of the disclosure provides a semiconductor structure. The semiconductor structure includes a carrier structure, and a stack structure located on the carrier structure. The stack structure includes at least one heat dissipation panel and at least one die module stacked onto one another, and the at least one die module includes at least one die. An area of an orthographic projection of the at least one heat dissipation panel on the carrier structure is greater than an area of an orthographic projection of the at least one die module on the carrier structure.

According to some embodiments of the disclosure, another aspect of some embodiments of the disclosure also provides a method for manufacturing a semiconductor structure. The method includes the following operations. A carrier structure and a stack structure are provided; and the stack structure is arranged on the carrier structure. The stack structure includes at least one heat dissipation panel and at least one die module stacked onto one another, and the at least one die module includes at least one die. An area of an orthographic projection of the at least one heat dissipation panel on the carrier structure is greater than an area of an orthographic projection of the at least one die module on the carrier structure.

BRIEF DESCRIPTION OF THE DRAWINGS

The drawings which are incorporated in the description and which constitute a part of the description illustrate embodiments according to the disclosure, and together with the description serve to explain the principle of the disclosure. It will be apparent that the drawings described below are only some embodiments of the disclosure, and those skilled in the art may obtain other drawings according to these drawings without creative labor.

DETAILED DESCRIPTION

Figure 1:
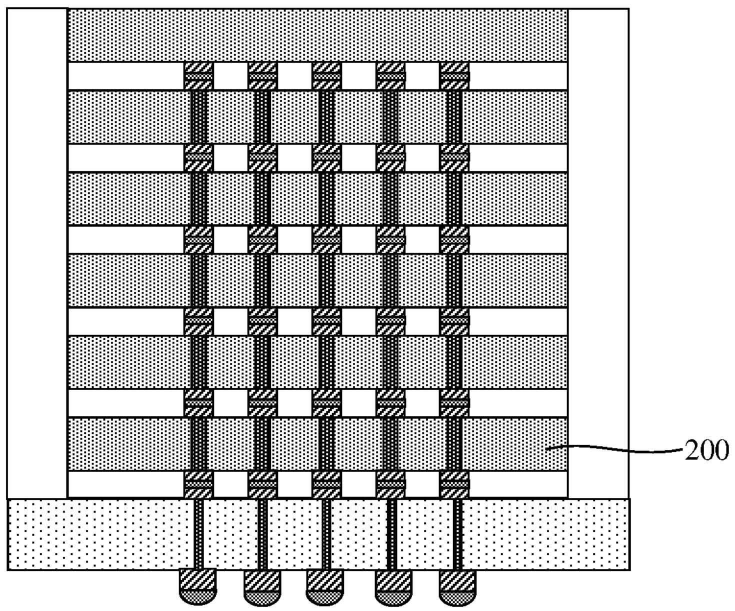
FIG. 1 shows a schematic diagram of a semiconductor structure.

Referring to FIG. 1, after analysis, it is found that as the number of stacked dies is increasing, an adhesive layer such as a die attach film (DAF) or a mold underfill is filled between one die 200 and another die 200 for adhering the one die 200 to the another die 200. As the dies 200 become thinner and thinner, a space between the one die 200 and the another die 200 becomes smaller and smaller. In this way, a heat dissipation space is reduced, and a heat generated by the dies 200 is accumulated, which affect the performance of a semiconductor structure.

Embodiments of the disclosure provide a semiconductor structure, where a stack structure includes at least one heat dissipation panel and at least one die module. An area of an orthographic projection of the at least one heat dissipation panel on a carrier structure is greater than an area of an orthographic projection of the at least one die module on the carrier structure. That is, the at least one heat dissipation panel extends outward relative to the at least one die module, and a heat generated by the at least one die module may be dissipated to an outer periphery of a package structure through the at least one heat dissipation panel. The at least one heat dissipation panel may guide a heat dissipation direction, which accelerates a heat dissipation speed of dies.

Embodiments of the disclosure will be described in detail below in combination with the drawings. However, those skilled in the art will appreciate that many technical details are presented in the various embodiments of the disclosure, in order to enable the reader to better understand the embodiments of the disclosure. However, even without these technical details and various variations and modifications based on the following various embodiments, the technical solutions claimed by the embodiments of the disclosure may be realized.

As shown in FIG. 2 to FIG. 11, an embodiment of the disclosure provides a semiconductor structure. The semiconductor structure includes a carrier structure 1, and a stack structure 4 located on the carrier structure 1. The stack structure 4 includes at least one heat dissipation panel 3 and at least one die module 2 stacked onto one another, and the at least one die module 2 includes at least one die 21. An area of an orthographic projection of the at least one heat dissipation panel 3 on the carrier structure 1 is greater than an area of an orthographic projection of the at least one die module 2 on the carrier structure 1.

That is, the at least one heat dissipation panel 3 extends outward relative to the at least one die module 2 in a direction parallel to an upper surface of the carrier structure 1. Since a heat is spontaneously transferred from a level at a high temperature to a level at a low temperature, and a temperature of the at least one die module 2 is greater than a temperature of an outer periphery of the at least one die module 2, the at least one heat dissipation panel 3 may quickly transfer a heat generated by the at least one die module 2 outward, to improve the degree of heat dissipation of the at least one die module 2 and prevent the influence of a high heat on the performance of the semiconductor structure.

The semiconductor structure will be described in detail below in combination with the drawings.

Referring to FIG. 2 to FIG. 4, and FIG. 8, in some embodiments, the carrier structure 1 may be a substrate. The substrate is mainly configured to protect the die 21 and electrically connect the die 21 to a peripheral circuit board. The substrate is made of a material with a good heat dissipation performance, and the substrate is for example an organic substrate or a ceramic substrate. In other embodiments, the die 21 may be a memory die such as a dynamic random access memory (DRAM), and the die 21 may also be a logic die. The memory die communicates with the logic die.

In some embodiments, one of a plurality of dies 21 close to the carrier structure 1 may be a logic die, and dies 21 of the plurality of dies 21 away from the carrier structure 1 may be memory dies.

In some embodiments, the carrier structure 1 may be a logic die.

In some embodiments, the at least one heat dissipation panel 3 may be a heat dissipation die such as a microchannel heat dissipation die. The microchannel heat dissipation die is provided with a microchannel. A cooling liquid may enter the microchannel to absorb the heat, and then be discharged from the microchannel to take away the heat. A heat dissipation rate is controlled by controlling a flow speed of the cooling liquid in the microchannel. In addition, a two-phase cooling liquid may be selected. That is, the two-phase cooling liquid may produce a phase change caused by a change of a temperature thereof, to take away more heat. In other embodiments, the at least one heat dissipation panel 3 may also be made of other materials with a high thermal conductivity, such as copper, graphene or aluminum nitride.

In addition, the at least one heat dissipation panel 3 may be provided with a rough surface to increase a heat dissipation area, which improves a heat dissipation effect. For example, the surface of the at least one heat dissipation panel 3 may include a nano-rough structure or a micron-rough structure. In some embodiments, the surface of the at least one heat dissipation panel 3 may have different flatness at different positions of this surface. For example, the flatness of a surface of the at least one heat dissipation panel 3 which is opposite to the at least one die module 2 may be greater than the flatness of a surface of the at least one heat dissipation panel 3 which extends outward relative to the at least one die module 2. For example, a portion of the at least one heat dissipation panel 3 which extends outward relative the at least one die module 2 may be provided with a protrusion or a depression. In this way, the heat dissipation area may be increased at the outer periphery of the at least one die module 2, and the welding of the at least one heat dissipation panel 3 to the at least one die module 2 may be facilitated, which improves the firmness of the welding.

Referring to FIG. 2 to FIG. 4, and FIG. 8, in some embodiments, the stack structure includes a plurality of die modules 2, and each of the plurality of die modules 2 alternates with a respective one of a plurality of heat dissipation panels 3 in a direction perpendicular to an upper surface of the stack structure 4. That is, each of the plurality of die modules 2 is arranged at least adjacent to one heat dissipation panel 3, and at least one die module 2 of the plurality of die modules 2 may also be arranged adjacent to two heat dissipation panels 3. In this way, it is beneficial to improve the uniformity of the distribution of the plurality of die modules 2 and the plurality of heat dissipation panels 3, which accelerates a heat transfer process. In addition, the alternating of each of the plurality of die modules 2 with the respective one of the plurality of heat dissipation panels 3 is also beneficial to increase a distance between any adjacent die modules 2 of the plurality of die modules 2, which provides a more sufficient heat dissipation space for the any adjacent die modules 2 of the plurality of die modules 2 to prevent the accumulation of the heat.

In some embodiments, at least one die module 2 of the plurality of die modules 2 includes a plurality of dies 21 stacked onto one another. By way of example, a thickness of each of the plurality of dies 21 is small, and the plurality of dies 21 may be stacked onto one another in a hybrid bonding manner. That is, a surface of each of the plurality of dies 21 is provided with a bonding part 23 and a dielectric layer (not shown in the drawings). An upper surface of the bonding part 23 may be flush with an upper surface of the dielectric layer, or the upper surface of the bonding part 23 may be slightly depressed relative to the upper surface of the dielectric layer. Under a condition of an increase of temperature, bonding parts 23 of any two adjacent dies 21 of the plurality of dies 21 are slightly expanded and bonded to each other to form an electrical connection, and dielectric layers of the any two adjacent dies 21 of the plurality of dies 21 may be connected to each other by means of an intermolecular force.

In other embodiments, the plurality of dies 21 may also be connected to each other by using a bump welding technique. That is, bumps allow surfaces of any adjacent dies 21 of the plurality of dies 21 to be spaced apart from each other, which provides a more sufficient heat dissipation space for the any adjacent dies 2 of the plurality of dies 2.

It should be noted that the thickness of each of the plurality of dies 21 is small, and a total thickness of the plurality of dies 21 stacked onto one another is increased, which is beneficial to weld the at least one die module 2 to a respective one of the plurality of heat dissipation panels 3. In addition, compared with the alternating of each single die 21 with a respective one of the plurality of heat dissipation panels 3, the alternating of the at least one die module 2 formed by the plurality of dies 21 stacked onto one another with a respective one of the plurality of heat dissipation panels 3 is beneficial to improve a utilization rate of the plurality of heat dissipation panels 3, reduce the number of the plurality of heat dissipation panels 3, and reduce a volume of the semiconductor structure.

In some embodiments, the number of the plurality of dies 21 of the at least one die module 2 is less than four. It should be noted that in a case that the number of the plurality of dies 21 of the at least one die module 2 is too much, a die 21 located at a middle position of the at least one die module 2 is far away from a respective one of the plurality of heat dissipation panels 3, which causes a heat generated by said die 21 to be unable to be dissipated in time. Therefore, the fact that the number of the plurality of dies 21 of the at least one die module 2 is controlled to be four or less than four is beneficial to improve an overall heat dissipation effect of the plurality of die modules 2.

Referring to FIG. 2 to FIG. 4, and FIG. 8, each die 21 is provided with first through vias 61 penetrating through said die 21, that is, the first through vias 61 extend in a direction perpendicular to the upper surface of the carrier structure 1. As an example, the first through vias 61 may be through-silicon vias (TSV). In addition, the surface of each die 21 may also be provided with pads 22 which are electrically connected to a circuit in said die 21, that is, the pads 22 serve as lead-out interfaces for the circuit. In addition, each of the first through vias 61 is connected to a respective one of the pads 22, which allows the first through vias 61 to be electrically connected to the circuit in each die 21. In a case that one die module 2 of the plurality of die modules 2 is provided with a plurality of dies 21, the first through vias 61 of the plurality of dies 21 are aligned with each other and connected to each other, which allows circuits in the entire die module 2 to be electrically connected to each other.

In some embodiments, a die 21 located at a topmost layer of the stack structure 4 may not be provided with the first through vias 61. A surface, which is provided with pads 22, of the die 21 located at the topmost layer of the stack structure 4 faces a die 21 located at a secondary top layer of the stack structure 4, and is electrically connected to the die 21 located at the secondary top layer of the stack structure 4. In this way, it is beneficial to omit the operation for manufacturing the first through vias 61 and save the production cost.

Referring to FIG. 2 to FIG. 4, and FIG. 8, each of the plurality of dies 21 includes a front surface A and a back surface B opposite to each other. It should be noted that in a process for manufacturing the plurality of dies 21, first, a base is provided, and then a structure such as a multilayer device or a circuit is formed on the base. The back surface B of each of the plurality of dies 21 is located at a side of each of the plurality of dies 21 where the base is located, and the front surface A of each of the plurality of dies 21 is located at a side of each of the plurality of dies 21 where the structure such as the multilayer device or the circuit is located. In some embodiments, the pads 22 may be formed on the front surface A of each of the plurality of dies 21, to simplify the production process.

When the plurality of dies 21 are in operation, the front surface A of each of the plurality of dies 21 generates more heat. That is, the front surface A of each of the plurality of dies 21 can be interpreted as a heat radiation surface. In some embodiments, the front surface A of a respective one of the plurality of dies 21 arranged adjacent to each heat dissipation panel 3 faces said heat dissipation panel 3. In this way, a distance between the heat radiation surface of a respective one of the plurality of dies 21 arranged adjacent to each heat dissipation panel 3 and said heat dissipation panel 3 may be reduced, that is, a heat transfer path may be shortened, which in turn improves the heat dissipation speed. An example of this description will be given below.

In a case that the at least one die module 2 of the plurality of die modules 2 includes the plurality of dies 21 stacked onto one another, the plurality of dies 21 include a die 21 located at a top layer of the at least one die module 2 and another die 21 located at a bottom layer of the at least one die module 2, and each of a front surface A of the die 21 located at the top layer of the at least one die module 2 and the another die 21 located at the bottom layer of the at least one die module 2 faces a respective one of the plurality of heat dissipation panels 3. That is, the heat radiation surface of the die 21 located at each of two outermost sides of the at least one die module 2 faces a respective one of the plurality of heat dissipation panels 3, which is beneficial to improve the heat dissipation effect.

In some embodiments, referring to FIG. 2 to FIG. 4, and FIG. 8, the at least one die module 2 includes two dies 21, and the front surface A of each of the two dies 21 faces a respective one of the plurality of heat dissipation panels 3. That is, the heat radiation surface of each of all the dies 21 of the at least one die module 2 may face a respective one of the plurality of heat dissipation panels 3, which ensures that the heat generated by each die 21 of the at least one die module 2 may be dissipated in time.

In other embodiments, the at least one die module 2 includes four dies 21. Herein, front surfaces A of upper two dies 21 of the four dies 21 face a heat dissipation panel 3 located above the at least one die module 2, and front surfaces A of lower two dies 21 of the four dies 21 face a heat dissipation panel 3 located below the at least one die module 2. That is, the uniformity of the distribution of the heat radiation surfaces of the four dies 21 of the at least one die module 2 is improved, and heat radiation surfaces of any two adjacent dies 21 of the four dies 21 are prevented from being arranged opposite to each other, to prevent the accumulation of the heat.

Referring to FIG. 2 to FIG. 4, and FIG. 8, a plurality of welding parts 5 are arranged between each of the plurality of die modules 2 and a respective one of the heat dissipation panels 3. That is, the plurality of welding parts 5 may not only improve the connection strength between each of the plurality of die modules 2 and the respective one of the plurality of heat dissipation panels 3, but also may transfer the heat generated by the plurality of die modules 2 to the plurality of heat dissipation panels 3 due to the excellent thermal conductivity of the plurality of welding parts 5.

In addition, each heat dissipation panel 3 is provided with second through vias 62 penetrating through said heat dissipation panel 3, and each of the plurality of welding parts 5 is electrically connected to a respective one of the first through vias 61 and a respective one of the second through vias 62. That is, the plurality of welding parts 5 may also play a role of the electrical connection. In addition, the plurality of welding parts 5 may be arranged at a bottom of the stack structure 4, to realize the electrical connection between the stack structure 4 and the carrier structure 1. That is, the plurality of welding parts 5, the first through vias 61 and the second through vias 62 which are electrically connected to each other constitute signal transmission paths in the direction perpendicular to the upper surface of the carrier structure 1. In this way, there is no need to electrically connect each of the plurality of die modules 2 to the carrier structure 1 through a conductive structure such as a lead or a lead frame, which is beneficial to reduce the volume of the semiconductor structure and improve the integration level of the semiconductor structure.

In some embodiments, at least one of the plurality of welding parts 5 is located at an edge of at least one of the plurality of die modules 2. Since an area of an orthographic projection of each of the plurality of heat dissipation panels 3 on the carrier structure 1 is greater than an area of an orthographic projection of a respective one of the plurality of die modules 2 on the carrier structure 1, in order to increase a supporting force on the plurality of heat dissipation panels 3, at least one of the plurality of welding parts 5 may be arranged at the edge of at least one of the plurality of die modules 2, which improves the structural strength, and prevents the plurality of heat dissipation panels 3 from tilting or collapsing.

The plurality of welding parts 5 are symmetrically distributed relative to a center of each of the plurality of die modules 2. That is, the uniformity of the distribution of the plurality of welding parts 5 is improved, which balances a connecting force between each of the die modules 2 and a respective one of the plurality of heat dissipation panels 3, and improves the firmness of the stack structure 4.

Referring to FIG. 2 to FIG. 4, and FIG. 8, the semiconductor structure may further include a package structure 7, which covers a part of a surface of each of the plurality of heat dissipation panels 3, and which exposes at least an outer peripheral surface of each of the plurality of heat dissipation panels 3. The package structure 7 also covers the plurality of die modules 2. In some embodiments, referring to FIG. 2, FIG. 3 and FIG. 8, the outer peripheral surface of each of the plurality of heat dissipation panels 3 is flush with an outer peripheral surface of the package structure 7. In this way, a shape of the semiconductor structure is more regular. In other embodiments, referring to FIG. 4, the package structure 7 may also expose a part of an upper surface of and a part of a lower surface of each of the plurality of heat dissipation panels 3. In this way, an exposed area of each of the plurality of heat dissipation panels 3 is greater, and the plurality of heat dissipation panels 3 may form a heat dissipation path along an outer side direction of the package structure 7, which is beneficial to improve the heat dissipation effect.

By way of example, a material of the package structure 7 may be an epoxy material, and may be an epoxy molding compound (EMC). A process for forming the package structure 7 may be a molding process.

A positional relationship and a dimensional relationship of the orthographic projection of each of the plurality of die modules 2 and the orthographic projection of a respective one of the plurality of heat dissipation panels 3 will be described in detail below.

Specifically, as shown in FIG. 2 to FIG. 11, the orthographic projection of each of the plurality of die modules 2 on the carrier structure 1 is located in the orthographic projection of a respective one of the plurality of heat dissipation panels 3 on the carrier structure 1. That is, an area of each of the plurality of die modules 2 directly facing a respective one of the plurality of heat dissipation panels 3 is the area of the orthographic projection of each of the plurality of die modules 2 on the carrier structure 1. At this time, the area of each of the plurality of die modules 2 directly facing the respective one of the plurality of heat dissipation panels 3 is the largest, and the plurality of heat dissipation panels 3 may fully receive the heat transmitted by the plurality of die modules 2, which improves the heat dissipation effect.

Figure 5:
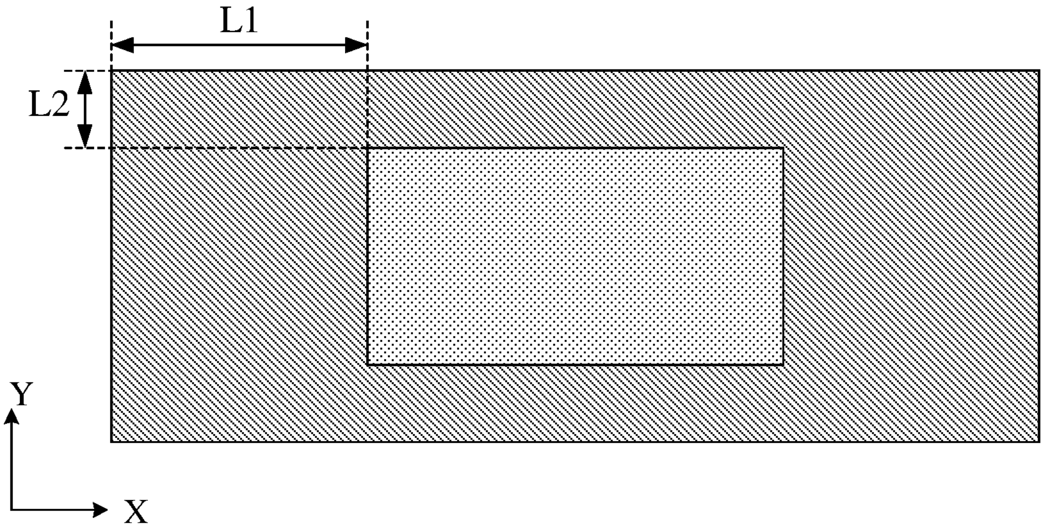
FIG. 5 shows a first top view of a plurality of heat dissipation panels and a plurality of die modules according to an embodiment of the disclosure.
Figure 6:
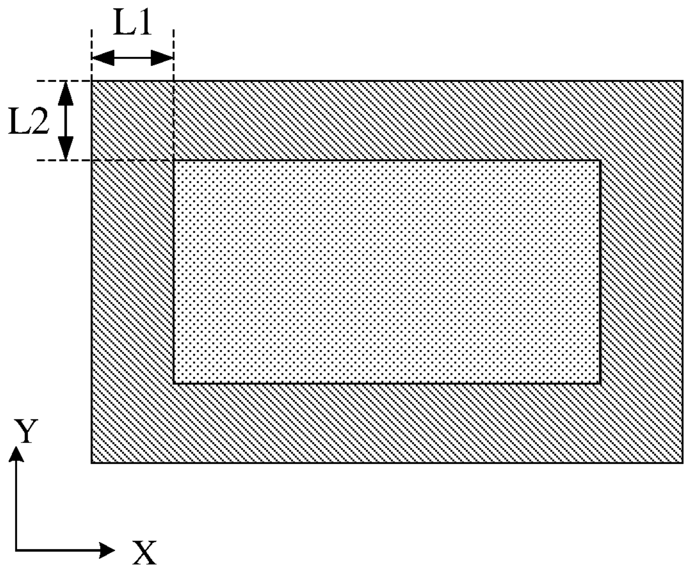
FIG. 6 shows a second top view of a plurality of heat dissipation panels and a plurality of die modules according to an embodiment of the disclosure.
Figure 7:
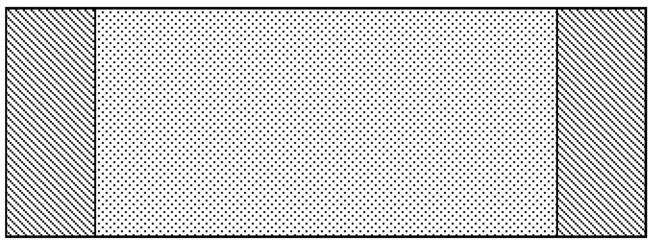
FIG. 7 shows a third top view of a plurality of heat dissipation panels and a plurality of die modules according to an embodiment of the disclosure.
Figure 8:
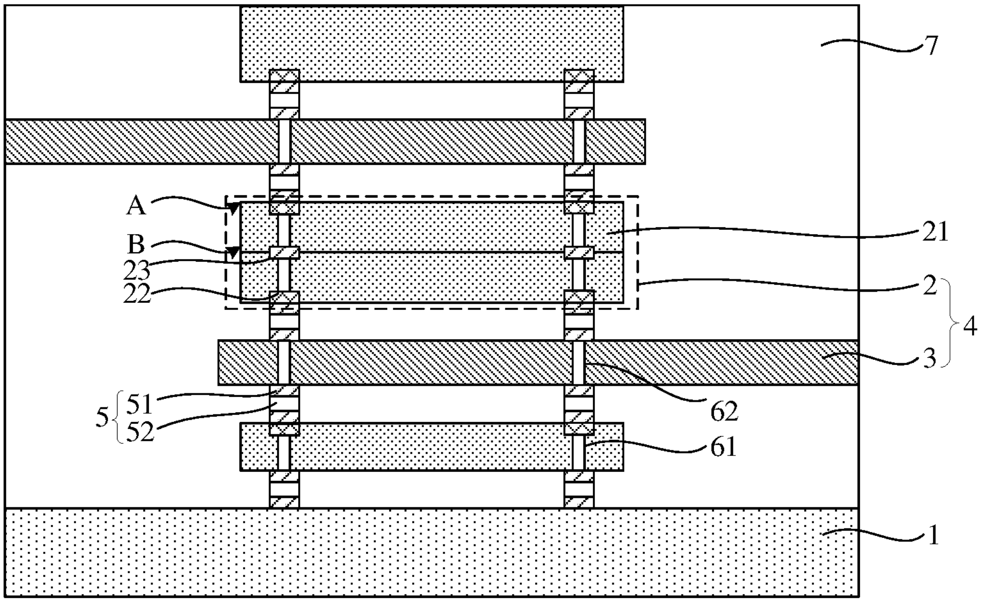
FIG. 8 shows a schematic diagram of still another semiconductor structure according to an embodiment of the disclosure.

In some embodiments, referring to FIG. 5 to FIG. 7, the orthographic projection of each of the plurality of die modules 2 on the carrier structure 1 is located at a center position of the orthographic projection of a respective one of the plurality of heat dissipation panels 3 on the carrier structure 1. That is, a center of the orthographic projection of each of the plurality of die modules 2 on the carrier structure 1 coincides with a center of the orthographic projection of a respective one of the plurality of heat dissipation panels 3 on the carrier structure 1. In this way, it is beneficial to improve the stability of the stack structure 4 and improve the uniformity of the heat dissipation of the plurality of die modules 2.

In some embodiments, referring to FIG. 5 and FIG. 6, all outer peripheral surfaces of each of the plurality of heat dissipation panels 3 are protruded relative to all outer peripheral surfaces of a respective one of the plurality of die modules 2. That is, there is a distance between an edge of the orthographic projection of each of the plurality of die modules 2 and an edge of the orthographic projection of a respective one of the plurality of heat dissipation panels 3. The orthographic projection of each of the plurality of die modules 2 on the carrier structure 1 and the orthographic projection of a respective one of the plurality of heat dissipation panels 3 on the carrier structure 1 may form a ring structure. That is, the plurality of heat dissipation panels 3 may guide the transfer of the heat along all outer peripheral directions of each of the plurality of die modules 2, which is beneficial to improve the degree of heat dissipation.

Referring to FIG. 5 and FIG. 6, the orthographic projection of each of the plurality of heat dissipation panels 3 on the upper surface of the carrier structure 1 may be rectangular, and the orthographic projection of each of the plurality of die modules 2 on the upper surface of the carrier structure 1 may be rectangular. A width of each of the plurality of die modules 2 in a first direction X is greater than a width of each of the plurality of die modules 2 in a second direction Y The first direction X is perpendicular to the second direction Y, and the first direction X and the second direction Y are parallel to the upper surface of the carrier structure 1. In the first direction X, there is a first distance L1 between an edge of the orthographic projection of each of the plurality of heat dissipation panels 3 and an edge of the orthographic projection of a respective one of the plurality of die modules 2. In the second direction Y, there is a second distance L2 between an edge of the orthographic projection of each of the plurality of heat dissipation panels 3 and an edge of the orthographic projection of a respective one of the plurality of die modules 2. In addition, the orthographic projection of each of the plurality of heat dissipation panels 3 on the upper surface of the carrier structure 1 may be circular, and the orthographic projection of each of the plurality of die modules 2 on the upper surface of the carrier structure 1 may be circular.

Referring to FIG. 5, in some embodiments, the first distance L1 is greater than the second distance L2, which is beneficial to balance the degree of heat dissipation of various parts of each of the plurality of die modules 2, and in turn improves the performance of the semiconductor structure. Referring to FIG. 6, in other embodiments, the first distance L1 may also be equal to the second distance L2, that is, the ring structure formed by the orthographic projection of each of the plurality of heat dissipation panels 3 and the orthographic projection of a respective one of the plurality of die modules 2 has a uniform ring width. In this way, it is beneficial to reduce the dimension of each of the plurality of heat dissipation panels 3 and reduce the volume of the semiconductor structure.

In some embodiments, referring to FIG. 7, at least one of all the outer peripheral surfaces of each of the plurality of heat dissipation panels 3 is protruded relative to at least one of all the outer peripheral surfaces of a respective one of the plurality of die modules 2. That is, other outer peripheral surfaces of all the outer peripheral surfaces of each of the plurality of heat dissipation panels 3 may also be flush with another outer peripheral surfaces of all the outer peripheral surfaces of the respective one of the plurality of die modules 2. By way of example, two opposite outer circumferential surfaces of all the outer peripheral surfaces of each of the plurality of heat dissipation panels 3 are protruded relative to two opposite outer circumferential surfaces of all the outer peripheral surfaces of a respective one of the plurality of die modules 2. In this way, it is beneficial to reduce the dimension of each of the plurality of heat dissipation panels 3 and reduce the volume of the semiconductor structure.

For example, referring to FIG. 7, the orthographic projection of each of the plurality of heat dissipation panels 3 on the upper surface of the carrier structure 1 may be rectangular, and the orthographic projection of each of the plurality of die modules 2 on the upper surface of the carrier structure 1 may be rectangular. That is, all the outer peripheral surfaces of each of the plurality of heat dissipation panels 3 may include four side surfaces, and all the outer peripheral surfaces of each of the plurality of die modules 2 may include four side surfaces. Herein, two opposite side surfaces of the four side surfaces of each of the plurality of heat dissipation panels 3 are flush with two opposite side surfaces of the four side surfaces of a respective one of the plurality of die modules 2, and remaining two opposite side surfaces of the four side surfaces of each of the plurality of heat dissipation panels 3 are protruded relative to remaining two opposite side surface of the four side surfaces of the respective one of the plurality of die modules 2.

Positional relationships and relationships of areas of orthographic projections of the plurality of heat dissipation panels 3 will be described in detail below.

In some embodiments, the stack structure includes a plurality of heat dissipation panels 3, and the orthographic projections of the plurality of heat dissipation panels 3 on the carrier structure 1 has the same area. In this way, the uniformity of the semiconductor structure is better and the process for manufacturing the semiconductor structure is simpler.

In other embodiments, the areas of the orthographic projections of the plurality of heat dissipation panels 3 on the carrier structure 1 may also be different from each other. For example, an area of an orthographic projection of a heat dissipation panel 3 located at a bottom layer of the semiconductor structure is greater, and an area of an orthographic projection of a heat dissipation panel 3 located at a top layer of the semiconductor structure is smaller. In this way, a center of gravity of the stack structure 4 may be reduced, to improve the stability of the stack structure 4.

A ratio of the area of the orthographic projection of each of the plurality of heat dissipation panels 3 on the carrier structure 1 to the area of the orthographic projection of a respective one of the plurality of die modules 2 on the carrier structure 1 is 1.5:1 to 3:1. In a case that the ratio of the area of the orthographic projection of each of the plurality of heat dissipation panels 3 on the carrier structure 1 to the area of the orthographic projection of the respective one of the plurality of die modules 2 on the carrier structure 1 is kept in the above range, the guiding function of the heat transfer of the plurality of heat dissipation panels 3 may be improved, and an area of a space occupied by the stack structure 4 on the carrier structure 1 may be saved.

Further, the area of the orthographic projection of each heat dissipation panel 3 may be proportional to the number of the dies 21 of die modules 2, closest to said heat dissipation panel 3, of the plurality of die modules 2. For example, a die module 2 is arranged on each of an upper side and a lower side of one heat dissipation panel 3 of the plurality of heat dissipation panels 3, and the total number of dies 21 of the two die modules 2 is 3. A die module 2 is arranged on each of an upper side and a lower side of another heat dissipation panel 3 of the plurality of heat dissipation panels 3, and the total number of dies 21 of the two die modules 2 is 4. The area of the orthographic projection of said another heat dissipation panel 3 may be greater than the area of the orthographic projection of said one heat dissipation panel 3. In this way, the degree of heat dissipation of each die module 2 may be balanced, a utilization rate of a space may be improved, and the waste of a space may be prevented.

In some embodiments, referring to FIG. 2 to FIG. 7, the orthographic projections of the plurality of heat dissipation panels 3 on the carrier structure 1 coincide with each other. That is, the orthographic projections of the plurality of heat dissipation panels 3 have the same area, and the plurality of heat dissipation panels 3 are aligned with each other in the direction perpendicular to the upper surface of the carrier structure 1. Therefore, a shape of the stack structure 4 is relatively regular, and the package structure 7 may be conveniently formed, which is beneficial to improve the stability of the stack structure 4, and prevent the stack structure 4 from tilting or collapsing caused by a uneven force acting on each heat dissipation panel 3.

In other embodiments, referring to FIG. 8 to FIG. 11, the orthographic projections of the plurality of heat dissipation panels 3 on the carrier structure 1 partly coincide with each other. That is, the plurality of heat dissipation panels 3 may be misaligned with each other, which is beneficial to fill a package material to reduce a gap generated when the package structure 7 is formed, and in turn improve a protection effect of the package structure 7 on the stack structure 4.

In addition, when the number of the plurality of heat dissipation panels 3 is greater than four, the orthographic projections of heat dissipation panels 3, located at odd-numbered layers, of the plurality of heat dissipation panels 3 on the carrier structure 1 coincide with each other, and the orthographic projections of heat dissipation panels 3, located at even-numbered layers, of the plurality of heat dissipation panels 3 on the carrier structure 1 coincide with each other.

Therefore, the center of gravity of the stack structure 4 may be close to a center position, to improve the stability of the stack structure 4.

Figure 9:
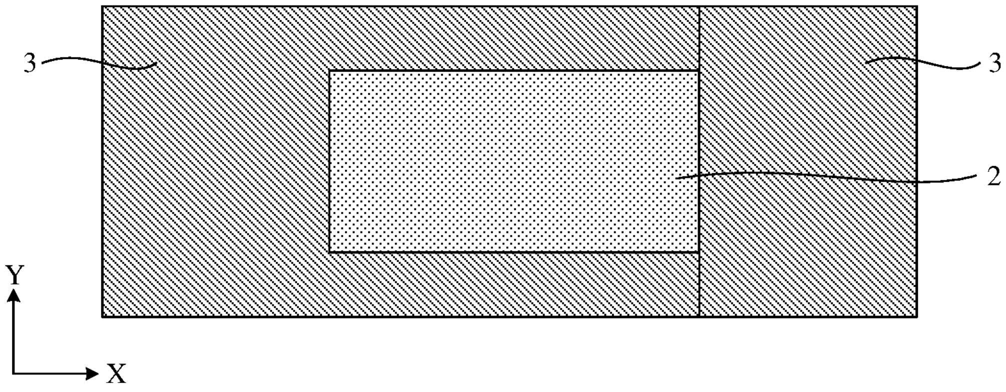
FIG. 9 shows a fourth top view of a plurality of heat dissipation panels and a plurality of die modules according to an embodiment of the disclosure.

Referring to FIG. 9, two heat dissipation panels 3 of the plurality of heat dissipation panels 3 are aligned with each other in the second direction Y, that is, the two heat dissipation panels 3 are not offset from each other in the second direction Y The two heat dissipation panels 3 of the plurality of heat dissipation panels 3 are offset from each other in the first direction X. The misalignment manner is relatively simple, and is beneficial to ensure the stability of the stack structure 4.

Figure 10:
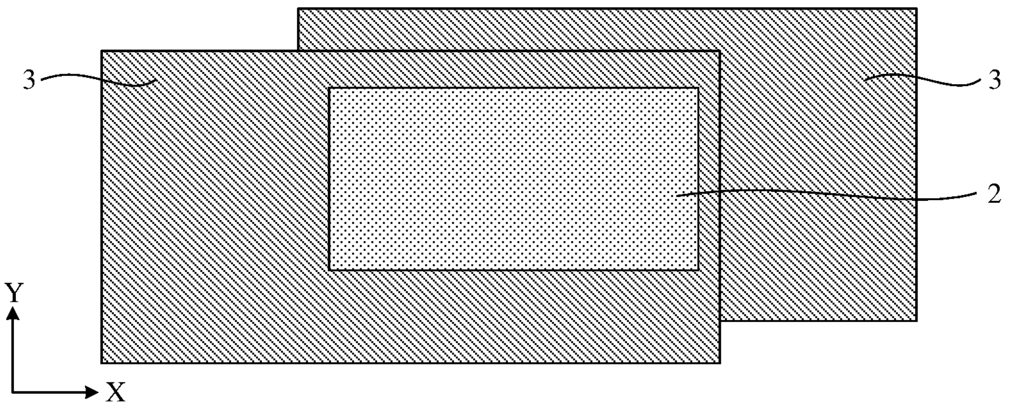
FIG. 10 shows a fifth top view of a plurality of heat dissipation panels and a plurality of die modules according to an embodiment of the disclosure.

Referring to FIG. 10, two heat dissipation panels 3 of the plurality of heat dissipation panels 3 are offset from each other in each of the first direction X and the second direction Y In this way, a space in which the package material is filled is greater. Therefore, a package material with large particles may be used.

Figure 11:
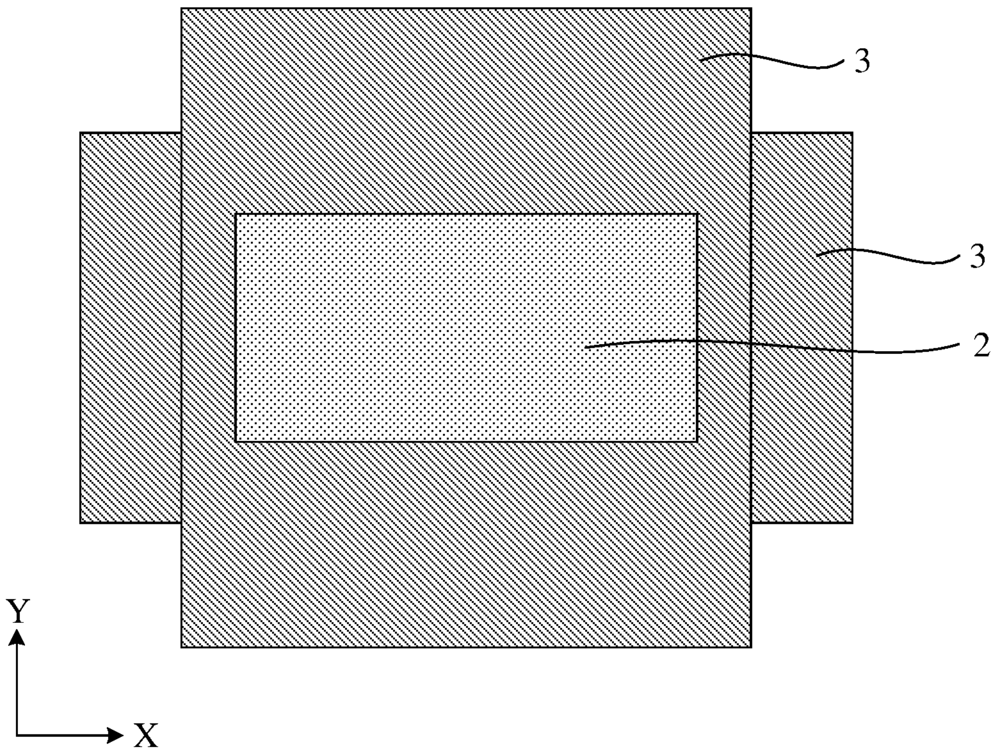
FIG. 11 shows a sixth top view of a plurality of heat dissipation panels and a plurality of die modules according to an embodiment of the disclosure.

Referring to FIG. 11, centers of two heat dissipation panels 3 of the plurality of heat dissipation panels 3 are aligned with each other, and a length direction of one heat dissipation panel 3 of the two heat dissipation panels 3 is perpendicular to a length direction of another heat dissipation panel 3 of the two heat dissipation panels 3. In addition, a center of each of the two heat dissipation panels 3 may be aligned with a center of a respective one of the plurality of die modules 2. Therefore, the stability of the stack structure 4 may be improved, and the stack structure 4 may be prevented from collapsing or tilting.

A thickness of each of the plurality of heat dissipation panels 3 will be described in detail below.

Figure 2:
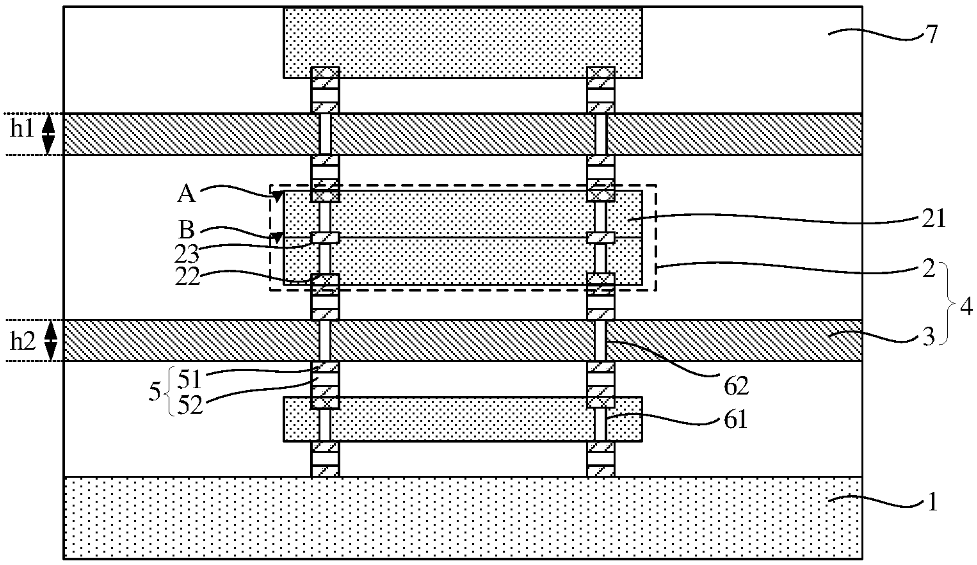
FIG. 2 shows a schematic diagram of a semiconductor structure according to an embodiment of the disclosure.

Referring to FIG. 2, the plurality of heat dissipation panels 3 may have the same thickness, which improves the uniformity of the stack structure 4, and makes the production process simpler.

Figure 3:
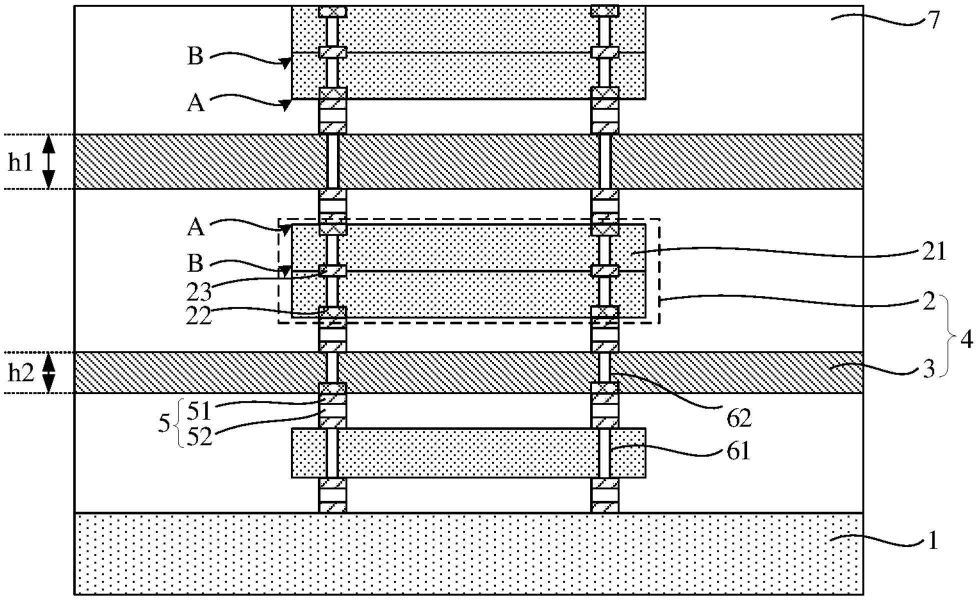
FIG. 3 shows a schematic diagram of another semiconductor structure according to an embodiment of the disclosure.
Figure 4:
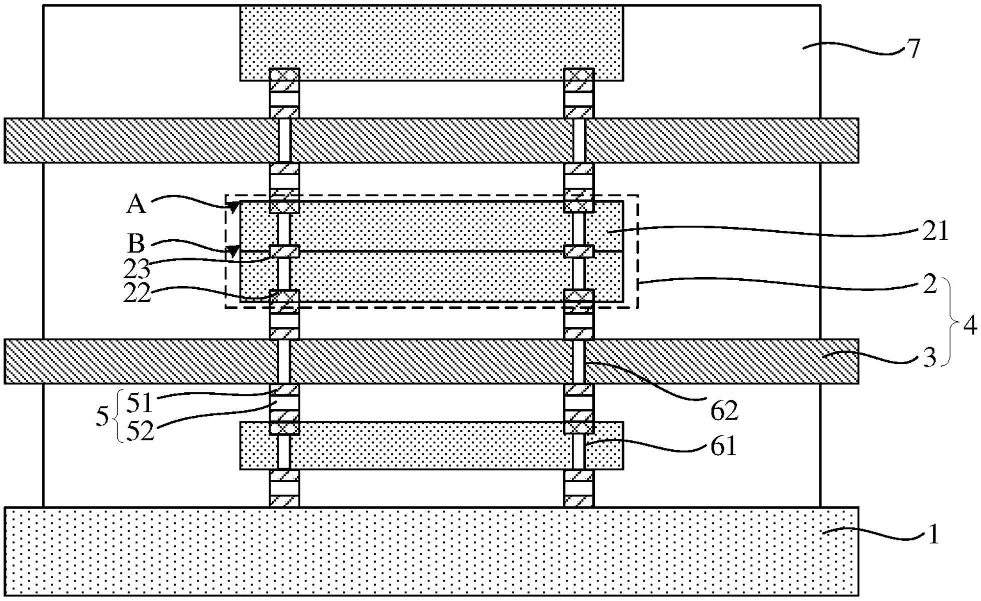
FIG. 4 shows a schematic diagram of yet another semiconductor structure according to an embodiment of the disclosure.

Referring to FIG. 3, the thickness of each heat dissipation panel 3 is proportional to the number of the dies 21 in a die module 2, closest to said heat dissipation panel 3, of the plurality of die modules 2. Specifically, die modules 2 on an upper side and a lower side of a heat dissipation panel 3 located at a bottom layer of the semiconductor structure are provided with three dies 21, and die modules 2 on an upper side and a lower side of a heat dissipation panel 3 located at a top layer of the semiconductor structure are provided with four dies 21. A thickness h2 of the heat dissipation panel 3 located at the bottom layer of the semiconductor structure is less than a thickness h1 of the heat dissipation panel 3 located at the top layer of the semiconductor structure. Thus, it is beneficial to improve the heat dissipation effect of the stack structure 4, and reduce a thickness of the stack structure 4 in the direction perpendicular to the upper surface of the carrier structure 1.

The thickness of each of the plurality of heat dissipation panels 3 may be less than a thickness of a respective one of the plurality of dies 21 in the direction perpendicular to the upper surface of the carrier structure 1. Since the area of the orthographic projection of each of the plurality of heat dissipation panels 3 is greater than an area of an orthographic projection of a respective one of the plurality of dies 21, the heat dissipation performance of the plurality of heat dissipation panels 3 is better. Accordingly, the thickness of each of the plurality of heat dissipation panels 3 may be reduced, to reduce an overall thickness of the stack structure 4.

For example, the thickness of each of the plurality of dies 21 may be comprised between 30 μm and 80 μm, such as 40 μm, 50 μm or 60 μm. The thickness of each of the plurality of heat dissipation panels 3 may be comprised between 10 μm and μm, such as 20 μm, 20 μm or 30 μm, which is beneficial to ensure the heat dissipation effect of the plurality of heat dissipation panels 3, and prevent the waste of the space.

In some embodiments, referring to FIG. 2 to FIG. 4, and FIG. 8, the plurality of die modules 2 include a die module 2 located at a bottommost layer of the stack structure 4 and another die 2 module located at a topmost layer of the stack structure 4. The die module 2 located at the bottommost layer of the stack structure 4 is welded to the carrier structure 1, and the another die module 2 located at the topmost layer of the stack structure 4 is located on a heat dissipation panel 3, located at a topmost layer of the semiconductor structure, of the plurality of heat dissipation panels 3. That is, a heat dissipation panel 3 is absent between the die module 2 located at the bottommost layer of the stack structure 4 and the carrier structure 1, and a heat dissipation panel 3 is absent on the another die module 2 located at the topmost layer of the stack structure 4.

It should be noted that compared with a die module 2 located at a middle position of the stack structure 4, it is easy for the heat generated by die modules 2 located at outermost sides of the stack structure 4 to be dissipated, that is, it is not easy for the heat generated by the another die module 2 located at the topmost layer of the stack structure 4, and the heat generated by the die module 2 located at the bottommost layer of the stack structure 4 to be accumulated. Therefore, heat dissipation panels 3 may be absent on the outermost sides of the stack structure 4, which reduce the number of the plurality of heat dissipation panels 3, to reduce a volume of the stack structure 4.

In some embodiments, the die module 2 located at the bottommost layer of the stack structure 4 includes one die 21, and the another die module 2 located at the topmost layer of the stack structure 4 includes one die 21. Since the heat dissipation panels 3 are absent on the outermost sides of the stack structure 4, the number of dies 21 of each of the die modules 2 located at the outermost sides of the stack structure 4 may be correspondingly reduced, to balance the degree of heat dissipation of each die 21.

In addition, a thickness of a die located at a topmost layer of the stack structure is generally greater. Therefore, there is no need to pre-bond the die located at the topmost layer of the stack structure to other dies 21 to increase a total thickness of a respective one of the plurality of die modules 2. The reason why the thickness of the die located at the topmost layer of the stack structure is greater lies in that in the integration of a subsequent product, other dies 21 such as processors are also arranged next to the stack structure 4. At present, the joint electron device engineering council (JEDEC) stipulates that a height of a top surface of each of the other dies 21 should follows a corresponding height standard. Therefore, the die 21 located at the topmost layer of the stack structure 4 is generally thicker, and a height of the die 21 located at the topmost layer of the stack structure 4 matches with the height of each of the other dies 21 to meet the requirements of the JEDEC.

In summary, in the embodiments of the disclosure, the plurality of heat dissipation panels 3 are added in the stack structure 4, and the plurality of heat dissipation panels 3 have an excellent heat dissipation effect, which may prevent the accumulation of the heat generated by the plurality of dies 21. In addition, the area of the orthographic projection of each of the plurality of heat dissipation panels 3 is greater than the area of the orthographic projection of a respective one of the plurality of die modules 2, which allows a heat dissipation path to be formed along an outer side direction to improve the degree of heat dissipation. That is, a material and an extension direction of each of the plurality of heat dissipation panels 3 are beneficial to improve the heat dissipation speed. In addition, the plurality of heat dissipation panels 3 may separate any adjacent die modules 2 of the plurality of die modules 2 from each other, which increases a distance between the any adjacent die modules 2, and provides a more heat dissipation space for the any adjacent die modules 2.

As shown in FIG. 12 to FIG. 15, and FIG. 2, another embodiment of the disclosure provides a method for manufacturing a semiconductor structure. The method for manufacturing the semiconductor structure according to an embodiment of the disclosure will be described in more detail below in combination with the drawings.

Referring to FIG. 12 to FIG. 15, and FIG. 2, a stack structure 4 is provided, the stack structure 4 including at least one heat dissipation panel 3 and at least one die module 2 stacked onto one another, where an area of an orthographic projection of the at least one heat dissipation panel 3 on a carrier structure 1 is greater than an area of an orthographic projection of the at least one die module 2 on the carrier structure 1.

Specifically, referring to FIG. 12 to FIG. 15, a plurality of die modules 2 are provided, each of the plurality of die modules 2 including at least one die 21. In some embodiments, at least one die module 2 of the plurality of die modules 2 may include two dies 21, and each of remaining die modules 2 of the plurality of die modules 2 may include one die 21.

Figure 12:
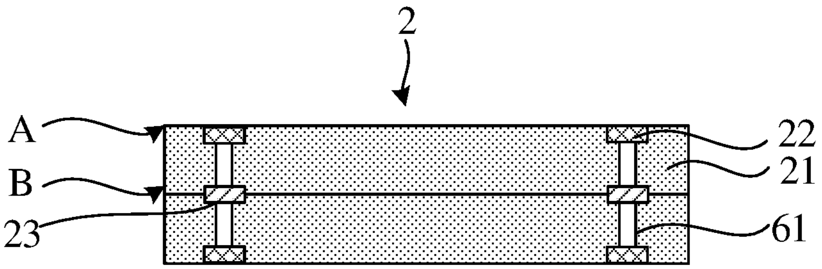
FIG. 12 shows a first schematic diagram of different die modules according to other embodiments of the disclosure.

Referring to FIG. 12, first through vias 61 and pads 22 are provided, where the pads 22 may lead a circuit in each die 21 to a surface thereof, and each of the first through vias 61 is electrically connected to a respective one of the pads 22. Two thin dies 21 are mixed-bonded in a back surface B to a back surface B, which allows a front surface A of each of the two dies 21 to be arranged outward, and the first through vias 61 of one of the two dies 21 are electrically connected to the first through vias 61 of another one of the two dies 21 by bonding parts 23. In some embodiments, the pads 22 are located on the front surface A of each of the two dies 21. Therefore, the pads 22 of the two dies 21 face away from each other.

Figure 13:
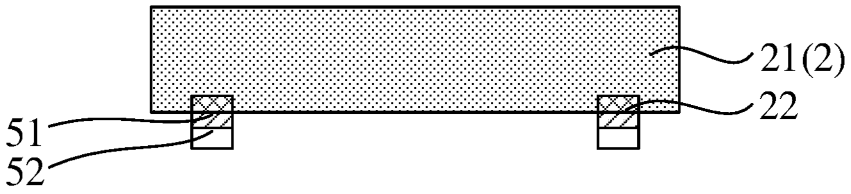
FIG. 13 shows a second schematic diagram of different die modules according to other embodiments of the disclosure.

Referring to FIG. 13, a thicker die 21 is provided as a die module 2 located at a top layer of the stack structure 4. Pads 22 are formed at a bottom of the die 21. Welding pads 51 connected to the pads 22, and welding bumps 52 connected to the pads 22 are formed at the bottom of the die 21. First through vias 61 penetrating through the die 21 do not need to be formed in the die 21, to simplify the production process.

Figure 14:
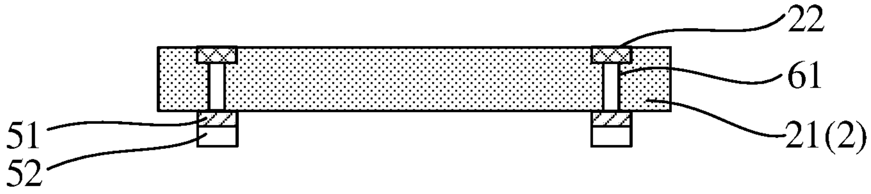
FIG. 14 shows a third schematic diagram of different die modules according to other embodiments of the disclosure.

Referring to FIG. 14, a die 21 is provided as a die module 2 located at a bottom layer of the stack structure 4. The first through vias 61 electrically connected to the pads 22 are formed in the die 21. Welding pads 51 connected to the first through vias 61, and welding bumps 52 connected to the first through vias 61 are formed at the bottom of the die 21.

Figure 15:
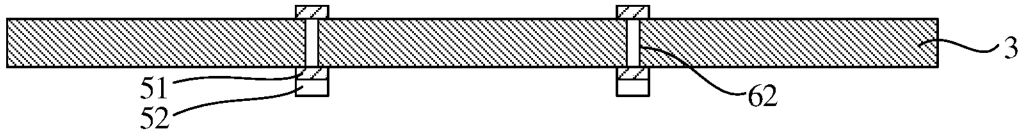
FIG. 15 shows a schematic diagram of a heat dissipation panel according to another embodiment of the disclosure.

Referring to FIG. 15, at least one heat dissipation panel 3 is provided, second through vias 62 penetrating through the at least one heat dissipation panel 3 are formed, welding pads 51 are formed on an upper surface of the at least one heat dissipation panel 3, and welding pads 51 and welding bumps 52 are formed on a lower surface of the at least one heat dissipation panel 3.

Referring to FIG. 2, a carrier structure 1 is provided, and the stack structure 4 is arranged on the carrier structure 1. In this way, a signal connection between each die 21 and the carrier structure 1 is formed. In a stacking process, it is necessary to turn a heat radiation surface of each die 21 towards a respective one of a plurality of heat dissipation panels 3.

After the stack structure 4 is arranged on the carrier structure 1, the method further includes the following operations. A package structure 7 is formed by a molding process. The package structure 7 covers a part of a surface of each of the plurality of heat dissipation panels 3, and exposes at least an outer peripheral surface of each of the plurality of heat dissipation panels 3. The package structure 7 also covers the plurality of die modules 2. Since the outer peripheral surface of each of the plurality of heat dissipation panels 3 is exposed, the heat may be transferred from the outer peripheral surface of each of the plurality of heat dissipation panels 3 to an exterior of the package structure 7, which improves a heat dissipation effect.

By way of example, the molding process may be a compression molding method. That is, the EMC is arranged in a mold, and then is melted. The compression molding method may reduce defects such as a gap.

In summary, in each of the plurality of die modules 2, the heat radiation surface of each die 21 is welded to a respective one of the plurality of heat dissipation panels 3, and the heat generated by each die 21 may be dissipated to the exterior of the package structure 7 by the plurality of heat dissipation panels 3. In addition, since each die 21 is relatively thin, a plurality of dies 21 may be pre-bonded by using a hybrid bonding or a bump welding technique. Circuits of the plurality of dies 21 are connected to each other by a conductive structure such as the TSVs, the welding pads 51 and the welding bumps 52. The circuits of the plurality of dies 21 are electrically connected to the carrier structure 1 by the welding pads 51 and the welding bumps 52 arranged on a lower surface of the die module 2 located at the bottom layer of the stack structure 4. In this way, a signal interconnection between each of the plurality of die modules 2 and the carrier structure 1 is realized.

In the description of the disclosure, the description of the terms "some embodiments", "as an example", and the like means that specific features, structures, materials, or characteristics described in combination with the embodiment or example are included in at least one embodiment or example of the disclosure. In the description, the schematic expressions of the above terms do not necessarily refer to the same embodiments or examples. In addition, the specific features, the structures, the materials, or the characteristics described may be combined in any one or more embodiments or examples in a suitable manner. In addition, those skilled in the art may combine and incorporate different embodiments or examples and features of the different embodiments or examples described in this description without conflict.

Although the embodiments of the disclosure have been shown and described above, it will be appreciated that the above embodiments are exemplary and are not to be understood as a limitation to the disclosure. Various changes, modifications, replacements and variations to the above embodiments may be made within the scope of protection of the disclosure by those skilled in the art. Therefore, any changes and modifications made in accordance with the claims and the description of the disclosure should be included within the scope of protection of the disclosure.

The invention claimed is:

1. A semiconductor structure, comprising:

a carrier structure; and a stack structure located on the carrier structure, wherein the stack structure comprises at least one heat dissipation panel and at least one die module stacked onto one another, and the at least one die module comprises a plurality of dies stacked onto one another, the plurality of dies are stacked by hybrid bonding, wherein an area of an orthographic projection of the at least one heat dissipation panel on the carrier structure is greater than an area of an orthographic projection of the at least one die module on the carrier structure, each of the plurality of dies comprises a front surface and a back surface opposite to each other, and the front surface of at least one of the plurality of dies is disposed to face the at least one heat dissipation panel;

wherein the stack structure comprises a plurality of die modules and a plurality of heat dissipation panels, and each of the plurality of die modules alternates with a respective one of the plurality of heat dissipation panels in a direction perpendicular to an upper surface of the stack structure.

2. The semiconductor structure according to claim 1, further comprising:

a package structure covering a part of a surface of the at least one heat dissipation panel and exposing at least an outer peripheral surface of the at least one heat dissipation panel, wherein the package structure also covers the at least one die module.

3. The semiconductor structure according to claim 1, wherein a plurality of welding parts are arranged between the at least one die module and the at least one heat dissipation panel.

4. The semiconductor structure according to claim 1, wherein the orthographic projection of the at least one die module on the carrier structure is located at a center position of the orthographic projection of the at least one heat dissipation panel on the carrier structure.

5. The semiconductor structure according to claim 1, wherein a thickness of the at least one heat dissipation panel is less than a thickness of the at least one die in a direction perpendicular to an upper surface of the carrier structure.

6. The semiconductor structure according to claim 1, wherein the stack structure comprises a plurality of heat dissipation panels, and orthographic projections of the plurality of heat dissipation panels on the carrier structure have a same area.

7. The semiconductor structure according to claim 1, wherein the stack structure comprises a plurality of die modules, and a thickness of the at least one heat dissipation panel is proportional to a number of dies in a die module, closest to the at least one heat dissipation panel, of the plurality of die modules.

8. The semiconductor structure according to claim 1, wherein the stack structure comprises a plurality of die modules, the plurality of die modules comprises a die module located at a bottommost layer of the stack structure and another die module located at a topmost layer of the stack structure, wherein the die module located at the bottommost layer of the stack structure is welded to the carrier structure, and comprises one die, and the stack structure comprises a plurality of heat dissipation panels, the another die module located at the topmost layer of the stack structure is located on a heat dissipation panel, located at a topmost layer of the semiconductor structure, of the plurality of heat dissipation panels, and the another die module located at the topmost layer of the stack structure comprises one die.

9. The semiconductor structure according to claim 1, the semiconductor structure comprises a heat dissipation panel located at a bottom layer of the semiconductor structure and a heat dissipation panel located at a top layer of the semiconductor structure, the die modules on an upper side and a lower side of the heat dissipation panel located at the bottom layer of the semiconductor structure are provided with three dies, and the die modules on an upper side and a lower side of the heat dissipation panel located at a top layer of the semiconductor structure are provided with four dies, a thickness of the heat dissipation panel located at the bottom layer of the semiconductor structure is less than a thickness of the heat dissipation panel located at the top layer of the semiconductor structure.

10. A semiconductor structure, comprising:

a carrier structure; and a stack structure located on the carrier structure, wherein the stack structure comprises at least one heat dissipation panel and at least one die module stacked onto one another, and the at least one die module comprises a plurality of dies stacked onto one another, the plurality of dies are stacked by hybrid bonding, wherein an area of an orthographic projection of the at least one heat dissipation panel on the carrier structure is greater than an area of an orthographic projection of the at least one die module on the carrier structure, each of the plurality of dies comprises a front surface and a back surface opposite to each other, and the front surface of at least one of the plurality of dies is disposed to face the at least one heat dissipation panel;

the stack structure comprises a plurality of heat dissipation panels, the plurality of dies comprise a die located at a top layer of the at least one die module and another die located at a bottom layer of the at least one die module, and each of a front surface of the die located at the top layer of the at least one die module and a front surface of the another die located at the bottom layer of the at least one die module faces a respective one of the plurality of heat dissipation panels.

11. The semiconductor structure according to claim 10, wherein the at least one die module comprises two dies, and the front surface of each of the two dies faces a respective one of the plurality of heat dissipation panels.

12. A semiconductor structure, comprising:

a carrier structure; and a stack structure located on the carrier structure, wherein the stack structure comprises at least one heat dissipation panel and at least one die module stacked onto one another, and the at least one die module comprises a plurality of dies stacked onto one another, the plurality of dies are stacked by hybrid bonding, wherein an area of an orthographic projection of the at least one heat dissipation panel on the carrier structure is greater than an area of an orthographic projection of the at least one die module on the carrier structure, each of the plurality of dies comprises a front surface and a back surface opposite to each other, and the front surface of at least one of the plurality of dies is disposed to face the at least one heat dissipation panel;

wherein a plurality of welding parts are arranged between the at least one die module and the at least one heat dissipation panel, the at least one die module is provided with first through vias penetrating through the at least one die module, the at least one heat dissipation panel is provided with second through vias penetrating through the at least one heat dissipation panel, and each of the plurality of welding parts is electrically connected to a respective one of the first through vias and a respective one of the second through vias.

13. The semiconductor structure according to claim 3, wherein at least one of the plurality of welding parts is located at an edge of the at least one die module.

14. The semiconductor structure according to claim 3, wherein the plurality of welding parts are symmetrically distributed relative to a center of the at least one die module.

* * * * *